(12) United States Patent
Tu et al.

(10) Patent No.: US 8,987,739 B2
(45) Date of Patent: Mar. 24, 2015

(54) SEMICONDUCTOR DEVICE AND MANUFACTURING METHOD THEREOF

(75) Inventors: Chen-Yuan Tu, New Taipei (TW); Yih-Chyun Kao, Changhua County (TW); Shu-Feng Wu, Miaoli County (TW); Chun-Nan Lin, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/424,382

(22) Filed: Mar. 20, 2012

(65) Prior Publication Data

US 2013/0168682 A1 Jul. 4, 2013

(30) Foreign Application Priority Data

Dec. 28, 2011 (TW) .............................. 100149292 A

(51) Int. Cl.
*H01L 31/00* (2006.01)
*H01L 29/786* (2006.01)
*H01L 27/12* (2006.01)

(52) U.S. Cl.
CPC ........ *H01L 29/7869* (2013.01); *H01L 27/1225* (2013.01); *H01L 27/1248* (2013.01)
USPC ................. 257/57; 257/59; 257/151; 438/151

(58) Field of Classification Search
CPC .......... H01L 27/00; H01L 21/00; H01L 29/00
USPC ......... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016, 57, E29.296, 59, 43, 257/E27.111, 288, E21.411, E21.46, 257/E21.704, E27.014, E29.255, E21.01, 257/E21.066, E21.19, E21.271, E21.409, 257/E21.605, E27.062, E27.069, E29.013, 257/E29.104, E29.313, 258, 369, 72; 438/158, 104, 151, 173, 30, 586
See application file for complete search history.

(56) References Cited

U.S. PATENT DOCUMENTS 7,241,673 B2   7/2007   Ahn et al.
7,714,949 B2   5/2010   Ming et al.
(Continued)

FOREIGN PATENT DOCUMENTS

CN    1945840      4/2007
TW    201126597    8/2011
(Continued)

OTHER PUBLICATIONS

"Office Action of China Counterpart Application", issued on Jun. 4, 2014, p. 1-p. 12.

(Continued)

*Primary Examiner* — Colleen A Matthews
*Assistant Examiner* — Junaiden Mirsalahuddin
(74) *Attorney, Agent, or Firm* — Jianq Chyun IP Office

(57) ABSTRACT

A semiconductor device and a manufacturing method thereof are provided. The semiconductor device includes a gate, a channel layer, a gate insulation layer, a source, a drain and a silicon-aluminum-oxide layer. The gate is disposed on a substrate. The channel layer is disposed on the substrate. The channel layer overlaps the gate. The gate insulation layer is disposed between the gate and the channel layer. The source and the drain are disposed on two sides of the channel layer. The silicon-aluminum-oxide layer is disposed on the substrate and covers the source, the drain and the channel layer.

20 Claims, 9 Drawing Sheets

(56) References Cited

U.S. PATENT DOCUMENTS

| | | |
|---|---|---|
| 7,915,075 B2 | 3/2011 | Suzawa et al. |
| 7,989,815 B2 | 8/2011 | Yamazaki et al. |
| 8,012,794 B2 | 9/2011 | Ye |
| 2004/0094790 A1* | 5/2004 | Kanaya .................. 257/300 |
| 2006/0088962 A1 | 4/2006 | Herman et al. |
| 2007/0063211 A1 | 3/2007 | Iwasaki |
| 2007/0194312 A1* | 8/2007 | Chuman et al. ............ 257/59 |
| 2008/0100766 A1* | 5/2008 | Ming et al. ................ 349/44 |
| 2009/0184315 A1 | 7/2009 | Lee et al. |
| 2010/0224939 A1* | 9/2010 | Kim et al. ................ 257/369 |

FOREIGN PATENT DOCUMENTS

| | | |
|---|---|---|
| TW | I348220 | 9/2011 |
| TW | I348235 | 9/2011 |
| TW | I348271 | 9/2011 |

OTHER PUBLICATIONS

"Office Action of Taiwan Counterpart Application", issued on May 23, 2014, p. 1-p. 7.

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 100149292, filed on Dec. 28, 2011. The entirety of the above-mentioned patent application is hereby incorporated by reference herein and made a part of this specification.

TECHNICAL FIELD

The disclosure relates to a semiconductor device and a method of manufacturing the same, and more particularly, to a semiconductor device with a silicon-aluminum-oxide layer and a method of manufacturing the same.

DESCRIPTION OF RELATED ART

With the rising awareness of environmental protection, flat display panels featuring low power consumption, optimized space utilization, free of radiation and high resolution have gradually become the mainstream product in the market. Common flat display panels include liquid crystal displays, plasma displays, electroluminescent displays, and so forth. Taking the most popular liquid crystal displays as an example, a liquid crystal display is constructed from a thin film transistor array substrate, a color filter substrate, and a liquid crystal layer interposed between the two aforementioned components.

A protection layer is commonly disposed on the known thin film transistor array substrate to protect a thin film transistor (semiconductor device). However, when an oxide semiconductor is used as a channel layer of the thin film transistor, if the oxide channel layer of the thin film transistor contacts a reducible element in the process of manufacturing the protection layer, the ratio between oxygen and metal is prone to change and influence the features of the thin film transistor. For example, referring to FIG. 1, when the properties of the oxide channel layer vary, the threshold voltage of the thin film transistor tends to shift leftward as the charging time increases, resulting in electrical instability. Therefore, providing appropriate protection to the channel layer has been an issue that the researchers are eager to settle nowadays.

SUMMARY

The disclosure provides a semiconductor device with excellent reliability and a method of manufacturing the same.

An embodiment of the disclosure provides a semiconductor device, including a gate, a channel layer, a gate insulation layer, a source, a drain, and a silicon-aluminum-oxide layer. The gate is disposed on the substrate. The channel layer is disposed on the substrate, and overlapped with the gate. The gate insulation layer is disposed between the gate and the channel layer. The source and the drain are disposed at two sides of the channel layer. The silicon-aluminum-oxide layer is disposed on the substrate and covers the source, the drain, and the channel layer.

Another embodiment of the disclosure also provides a method of manufacturing a semiconductor device including the following steps. A gate is formed on a substrate. Then a channel layer is formed on the substrate, wherein the channel layer is overlapped with the gate. A gate insulation layer is formed between the gate and the channel layer. A source and a drain are formed, wherein the source and the drain are disposed at two sides of the channel layer. A silicon-aluminum-oxide layer is formed on the substrate, covering the source, the drain, and the channel layer.

According to an embodiment of the disclosure, the silicon-aluminum-oxide layer mentioned above has a silicon-to-aluminum content ratio from 10:90 to 90:10.

According to an embodiment of the disclosure, the semiconductor device mentioned above further includes a pixel electrode disposed on the silicon-aluminum-oxide layer and electrically connected to the drain.

According to an embodiment of the disclosure, a material of the gate insulation layer mentioned above includes silicon-aluminum-oxide, and the gate insulation layer has a silicon-to-aluminum content ratio from 10:90 to 90:10.

In an embodiment of the disclosure, the gate mentioned above is disposed between the substrate and the channel layer.

According to an embodiment of the disclosure, the source and drain mentioned above are disposed between the channel layer and the substrate.

According to an embodiment of the disclosure, the source and the drain are disposed between the channel layer and the silicon-aluminum-oxide layer.

According to an embodiment of the disclosure, the semiconductor device mentioned above further includes an etched blocking pattern, covering a portion of the channel layer and disposed between the source and the drain.

According to an embodiment of the disclosure, the channel layer mentioned above is disposed between the substrate and the gate.

According to an embodiment of the disclosure, the silicon-aluminum-oxide layer mentioned above is disposed between the gate and the channel layer.

According to an embodiment of the disclosure, a method of forming the silicon-aluminum-oxide layer mentioned above includes physical vapor deposition.

According to an embodiment of the disclosure, a method of manufacturing the semiconductor device mentioned above further includes forming a contact window in the silicon-aluminum-oxide layer to expose the drain.

According to an embodiment of the disclosure, a method of forming the contact window mentioned above includes using a fluorine-series gas as the major etchant, wherein the fluorine-series gas includes sulfide hexafluoride ($SF_6$) or tetrafluoromethane ($CF_4$).

According to an embodiment of the disclosure, a method of manufacturing the semiconductor device mentioned above further includes forming a pixel electrode on the silicon-aluminum-oxide layer, which is electrically connected with the drain.

According to an embodiment of the disclosure, a method of forming the semiconductor device mentioned above further includes forming an etched blocking pattern covering a portion of the channel layer and disposed between the source and the drain.

Given above, the silicon-aluminum-oxide layer may be formed on the channel layer of the semiconductor device of the disclosure, such that the channel layer is protected from variation. In addition, since the material of the gate insulation layer may be the same as the material of the silicon-aluminum-oxide layer, undercut caused by different etch rates of different materials can be avoided when forming a via of the pad region.

BRIEF DESCRIPTION OF THE DRAWINGS

For further understanding to the features and advantages of the disclosure described above, the embodiments are described in details below with reference to the accompanying drawings.

DETAILED DESCRIPTION OF DISCLOSED EMBODIMENTS

FIGS. 2A to 2F are cross-sectional diagrams illustrating a process of manufacturing a semiconductor device according to an embodiment of the disclosure.

Figure 2A:
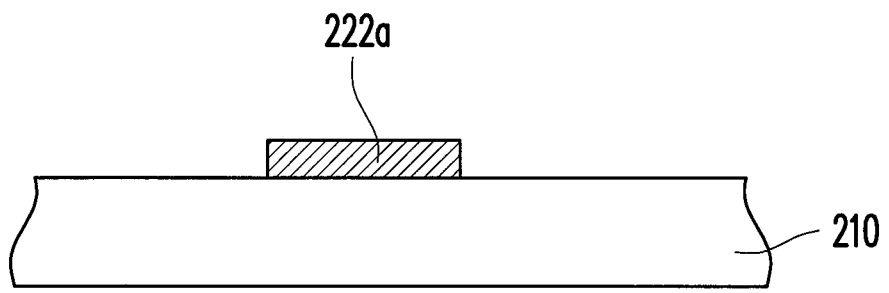
FIGS. 2A to 2F are schematic cross-sectional views illustrating the process of manufacturing a semiconductor device according to an embodiment of the disclosure.

First, referring to FIG. 2A, a gate 222a is formed on a substrate 210, wherein the gate 222a may be constructed from a metal stack, or a single-layer metal layer, formed from metals with high conductivity, such as aluminum, copper, or the like.

Figure 2B:
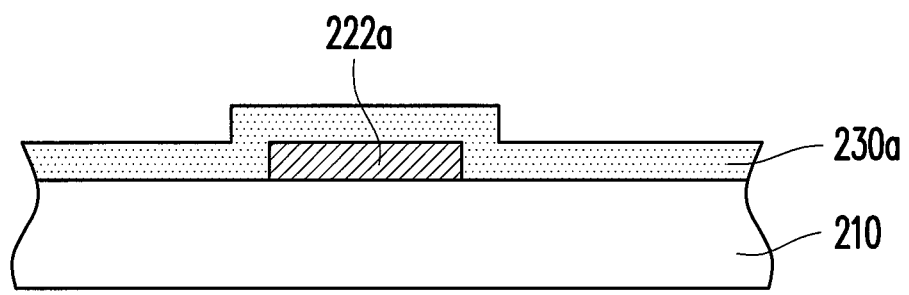

Referring to FIG. 2B, a gate insulation layer 230a covers on the substrate 210 and covers the gate 222a. The gate insulation layer 230a is formed from, for example, an inorganic material (e.g. silicon oxide, silicon nitride, nitroxide silicon, silicon-aluminum-oxide, or a stacked layer of at least two of the materials above), an organic material, or a combination of the above. It is beyond question that the embodiment is not limited by the aforementioned materials. Any insulating material may be selectively applied to the embodiment disclosed herein to form the gate insulation layer 230a.

Figure 2C:
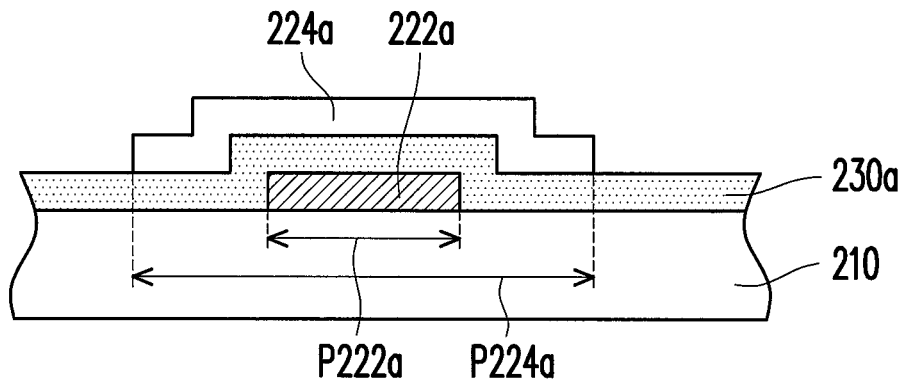

Referring to FIG. 2C, a channel layer 224a is formed on the substrate 210, wherein the gate insulation layer 230a is disposed between the channel layer 224a and the gate 222a. Further, the channel layer 224a and the gate 222a are overlapped. Specifically, at least a portion of an orthographic projection P222a of the gate 222a on the substrate 210 is covered by an orthographic projection P224a of the channel layer 224a on the substrate 210. As for the embodiment disclosed herein, the orthographic projection P222a of the gate 222a on the substrate 210 is completely covered by the orthographic projection P224a of the channel layer 224a on the substrate 210. Namely, the orthographic projection P224a of the channel layer 224a on the substrate 210 and the orthographic projection P222a of the gate 222a on the substrate are overlapped with each other. Moreover, a material of the channel layer includes crystalline silicon, amorphous silicon, poly-silicon, organic semiconductor, or metal oxide semiconductor. In the embodiment disclosed herein, the material of the channel layer 224a is, for example, indium gallium zinc oxide (IGZO).

Figure 2D:
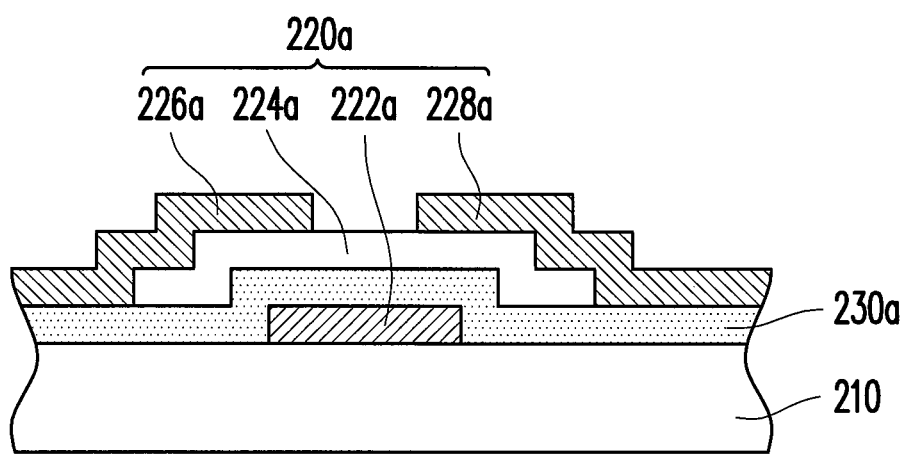

In the following, referring to FIG. 2D, a source 226a and a drain 228a are formed at two sides of the channel layer 224a, wherein the source 226a and the drain 228a may be constructed from a metal stack or a single-layer metal layer, which is formed from, for example, metals with high conductivity, such as aluminum, copper, silver, or the like. Here, the gate 222a, channel layer 224a, source 226a, and drain 228a form a thin film transistor 220a.

Figure 2E:
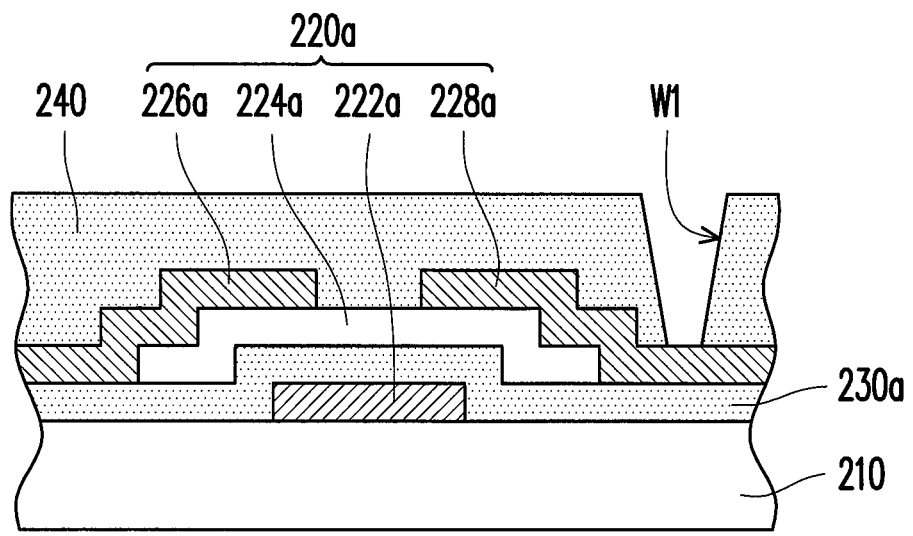

Referring to FIG. 2E, a silicon-aluminum-oxide layer 240 is formed on the substrate 210 and covers the source 226a, drain 228a, and channel layer 224a. In the embodiment disclosed herein, a method of forming the silicon-aluminum-oxide layer 240 includes a physical vapor deposition (PVD) process. In general, the ratio between silicon content and aluminum content influences the features of the silicon-aluminum-oxide layer 240, wherein the more the aluminum content is, the slower the deposition rate becomes and the more difficult the film layer is etched, while the more the silicon content is, the less the protection to the channel layer 224a becomes, rendering the device features of the film transistor 220 unsatisfactory. Therefore, the ratio between silicon content and aluminum content is configured to range from 10:90 to 90:10 in the embodiment disclosed herein.

In the related art, silicon oxide ($SiO_x$) or silicon nitride ($SiN_x$) is formed on the thin film transistor as the protection layer of the thin film transistor through plasma enhanced chemical vapor deposition (PECVD) process. However, in the process of PECVD, the material of the channel layer (such as the IGZO channel layer in the embodiment disclosed herein) is prone to react with reducible elements (such as a reducible ingredient in plasma), and result in change of the uniformity and electricity of a semiconductor device.

The material of the channel layer 224a of the embodiment disclosed herein is metal oxide semiconductor. Therefore, in the process of PECVD, if a reduction reaction caused by hydrogen in $SiH_4$ in plasma occurs on the channel layer 224a, the electric characteristic of the channel layer 224a may turn from semi-conductive to conductive due to the loss of the oxygen ingredient, thereby, the channel layer 224a may directly conduct the source 226a and the drain 228a and result in malfunctioning of the thin film transistor 220a. Therefore, according to the embodiment disclosed herein, the silicon-aluminum-oxide layer 240 as a protection layer of the thin film transistor 220 is fabricated by the PVD process which does not require the reducible element-containing component such as $SiH_4$, such that the channel layer 224a has a preferable uniformity and electricity. It is beyond question that the method of forming the silicon-aluminum-oxide layer 240 in the embodiment described herein is not restricted to the PVD process.

In addition, when the channel layer 224a is formed from crystalline silicon, amorphous silicon, poly-silicon or other semiconductor materials, the silicon-aluminum-oxide layer 240 may provide the desired protection such that the channel layer 224a has the desired device features. Therefore, the embodiment described herein has no limitation on the material of the channel layer 224a.

Then, to form the device in need, a contact window W1 is formed in the silicon-aluminum-oxide layer 240 to expose the drain 228a. In the embodiment described herein, the method of forming the contact window W1 includes using a fluorine-series gas as the major etchant, wherein the fluorine-series gas includes sulfide hexafluoride or tetrafluoromethane, which is applied to the known etching process for etching silicon oxide or silicon nitride protection layers as etchant. In other words, although the embodiment disclosed herein chooses the silicon-aluminum-oxide layer 240 as the protection layer of the thin film transistor 220a rather than the well-known material such as silicon oxide, silicon nitride or the like, the material chosen as etchant (the fluorine-series gas) can be the same as the material used in the known etching process. Therefore, no new etchant needs to be specifically prepared.

Note that a portion of the silicon-aluminum-oxide layer 240 and a portion of the gate insulation layer 230a are etched while forming a via of a chip bonding pad region (not shown). To avoid an undercut caused by different etch rates, the material of the gate insulation layer 230 in the embodiment described herein can selectively be silicon-aluminum-oxide, which is the same as the silicon-aluminum-oxide layer 240. The silicon-to-aluminum content ratio of the gate insulation layer 230a can also be configured to range from 10:90 to 90:10. Thereby, the undercut effect can be reduced.

Furthermore, the method of forming the gate insulation layer 230a can be the same as the method of forming the silicon-aluminum-oxide layer 240. Thereby, it can be avoided that when the gate insulation layer 230a is formed during the PECVD process, hydrogen is generated and remained in the gate insulation layer 230a. As such, the influence on the uniformity of device due to the remained hydrogen during the subsequent high-temperature annealing is diminished. Therefore, in the embodiment described herein, the possibility that the uniformity of device varies during the process of manufacture is reduced by using the same method to form the gate insulation layer 230a and the silicon-aluminum-oxide layer 240.

Figure 2F:
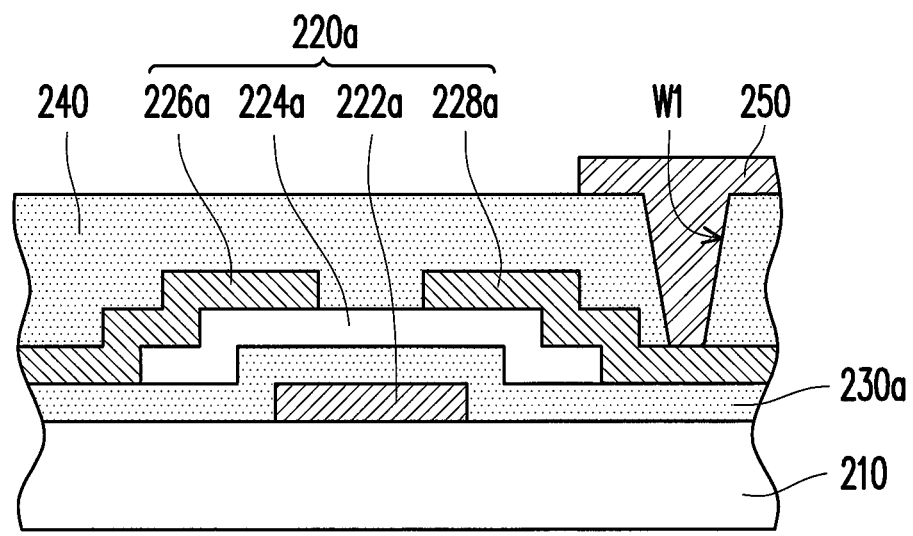

Referring to FIG. 2F, a pixel electrode 250 is formed on the silicon-aluminum-oxide layer 240, wherein the pixel electrode 250 is electrically connected with the drain 228a through the contact window W1. The manufacture of the semiconductor device 200 is substantially completed herein. The known silicon oxide or silicon nitride layer is replaced by the silicon-aluminum-oxide layer 240 as the protection layer of the thin film transistor 200a in the manufacture of semiconductor device 200, which avoids the reaction between a reducible element and the material of the channel layer 224a and prevents from variation of the semiconductor device 200 such that the uniformity and electric characteristic of the semiconductor device 200 are improved.

Figure 3:
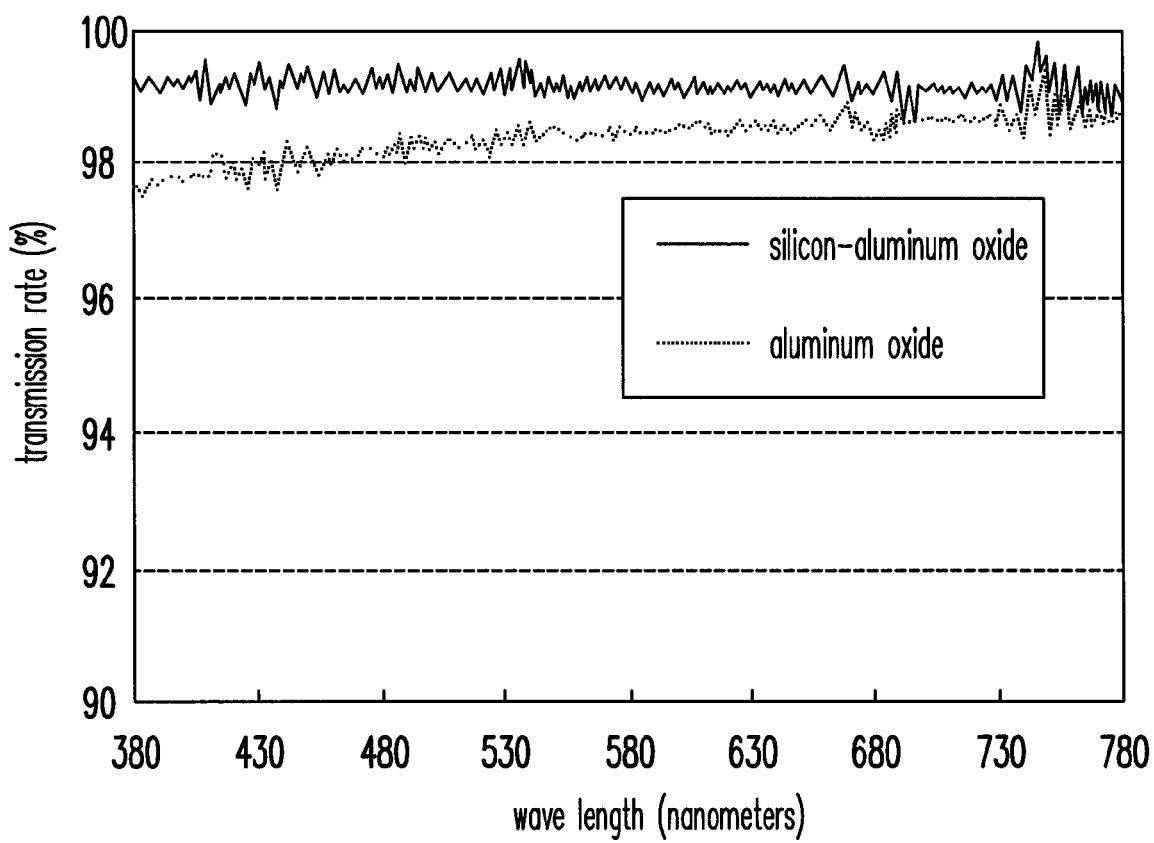
FIG. 3 is a diagram showing the transmission rates of an aluminum-oxide layer and a silicon-aluminum-oxide film layers.
Figure 4A:
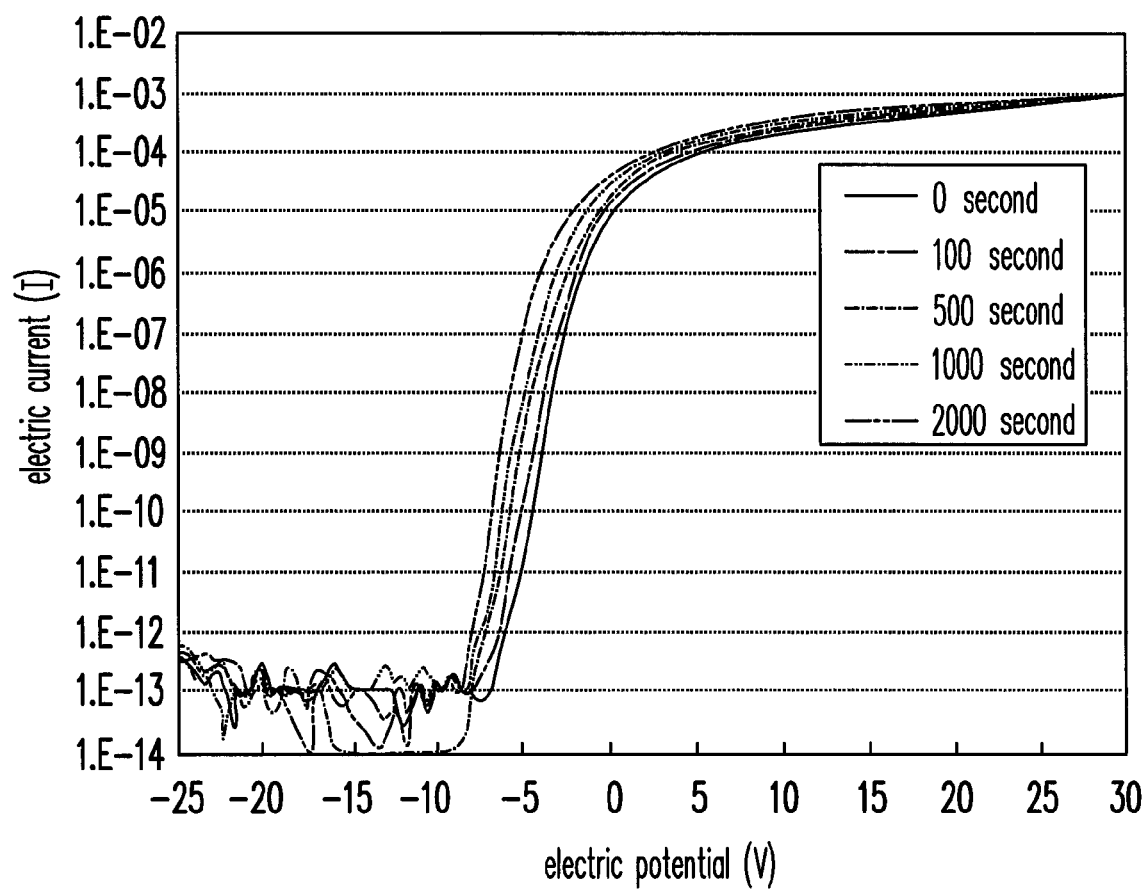
FIG. 4A is a diagram illustrating a reliability test curve of a semiconductor device having a silicon-to-aluminum content ratio of 90:10.
Figure 4B:
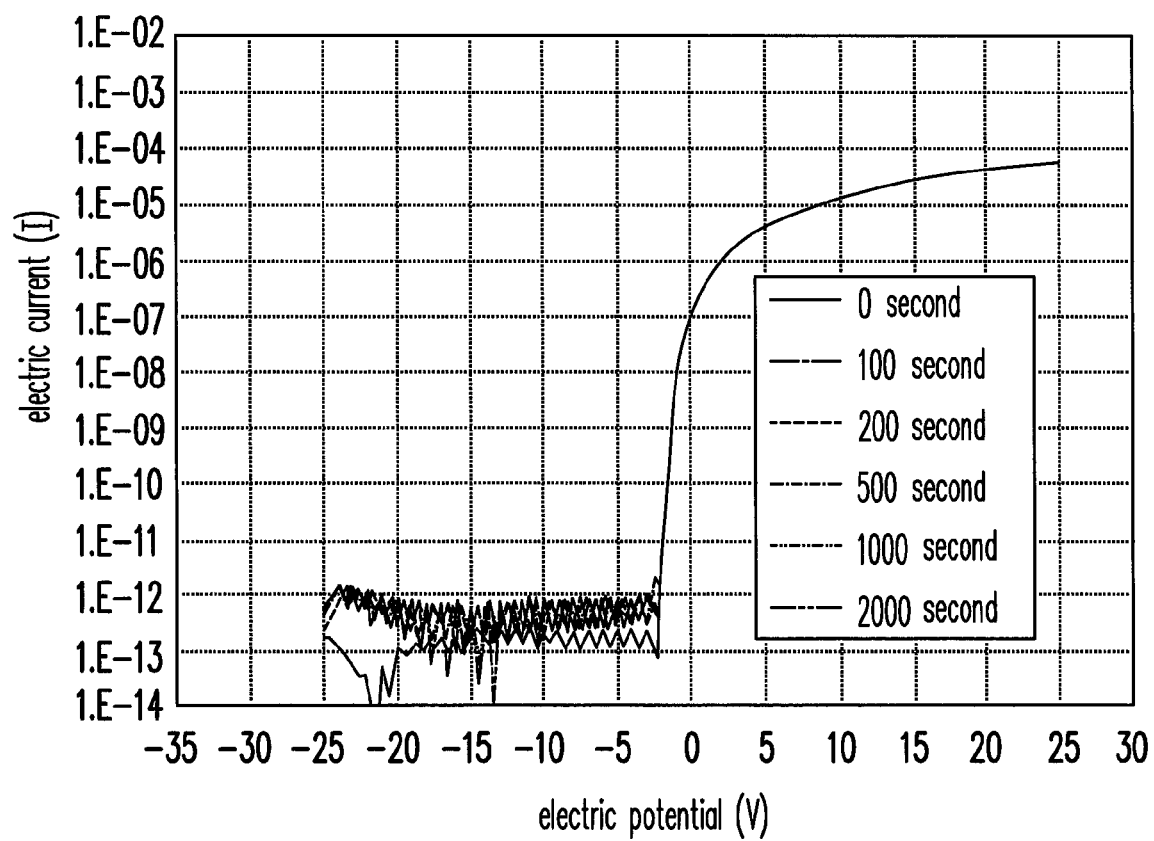
FIG. 4B is a diagram illustrating a reliability test curve of a semiconductor device having a silicon-to-aluminum content ratio of 70:30.

Note that in addition to the advantage of diminishing the variation of the channel layer 224a due to the manufacturing process, the silicon-aluminum-oxide layer 240 described in the embodiment disclosed herein also excels at water resistance to further avoid the variation of the channel layer 224a due to the external environment. What to be set forth herein is that aluminum oxide also excels at water resistance, and thus compared to aluminum oxide, silicon-aluminum oxide is more suitable to be applied in a thin film transistor as a protection layer. With reference to FIGS. 3, 4A, 4B, and Table 1, a detailed description of the device features of aluminum oxide and silicon-aluminum oxide are described below.

FIG. 3 is a diagram showing the transmission rates of the aluminum-oxide and silicon-aluminum-oxide film layers. Referring to FIG. 3, in the visible light whose wave length ranging from 380 nanometers to 780 nanometers, it can be found that doping an appropriate amount of silicon in aluminum oxide ($AlO_x$) improves the transmission rate of the device.

Table 1 shows the coating rates and etching rates of aluminum oxide doped with silicon by different amounts. In this exemplary example, the aluminum-oxide and silicon-aluminum-oxide film layers are formed by, for example, sputtering.

Further, the etching rate listed in Table 1 is the etching rate using hexafluoride as etchant to etch the aluminum-oxide and silicon-aluminum-oxide film layers.

Based on Table 1, it can be found that doping an appropriate amount of silicon in aluminum oxide facilitates the film forming and etching rates. Specifically, the coating rate of silicon-aluminum oxide can be two to five times faster than the coating rate of substantially pure aluminum oxide (silicon-to-aluminum content ratio equals to 0:100). Additionally, it can be found in Table 1 that the etching rate of substantially pure aluminum oxide with the etchant of hexafluoride is nearly zero, or relatively low. Therefore, if aluminum oxide is chosen as the material of the protection layer of the thin film transistor 220a, a more corrosive etchant, such as boron trichloride ($BCl_3$), and stronger energy are required. Consequently, in the embodiment disclosed herein, the silicon-aluminum-oxide layer 240 with better film forming and etching rates are chosen as the protection layer of the thin film transistor 220a, wherein the silicon-to-aluminum content ratio in the silicon-aluminum-oxide layer 240 ranges from 10:90 to 90:10.

TABLE 1

| Components of the film layers (silicon-to-aluminum ratio) | Film forming rate (Å/second) | Etching rate (Å/second) | Reliability |
|---|---|---|---|
| 0:100 | 1.6 | 0 | Good |
| 10:90 | 3.7 | 5.3 | Good |
| 30:70 | 6.2 | 10.7 | Good |
| 50:50 | 6.5 | 15.5 | Good |
| 60:40 | 6.7 | 18.7 | Good |
| 70:30 | 6.9 | 19.3 | Good |
| 80:20 | 9.2 | 21.3 | Good |
| 85:15 | 8.7 | 22.6 | Good |
| 90:10 | 9.3 | 23.9 | Good |

Figure 1:
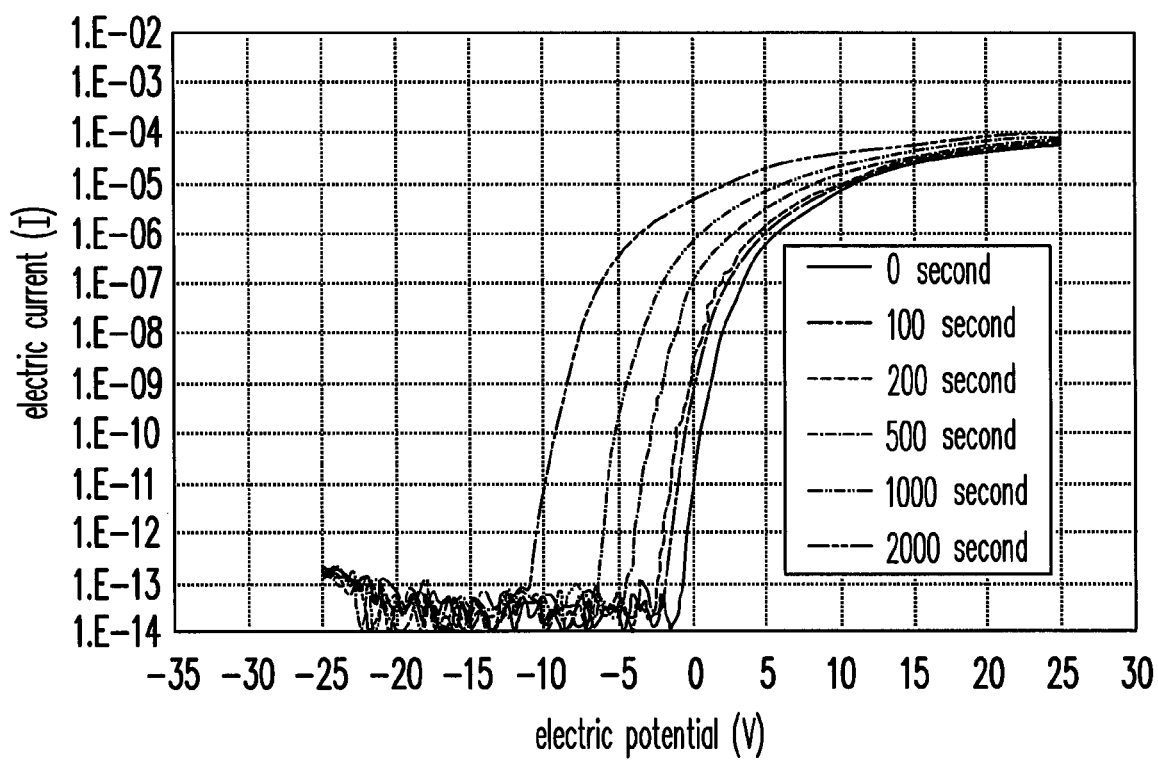
FIG. 1 is a diagram illustrating a reliability test curve of a known semiconductor device.

The reliability listed in the rightmost column of Table 1 will be further explained below with reference to FIGS. 4A and 4B. FIG. 4A is a diagram illustrating the reliability test curve of a semiconductor device with a silicon-to-aluminum content ratio of 90:10. FIG. 4B is a diagram illustrating the reliability test curve of a semiconductor device with a silicon-to-aluminum content ratio of 70:30. As illustrated in FIGS. 4A and 4B, the reliability of a semiconductor device is improved with an appropriate amount of silicon doped in aluminum oxide as the material of the protection layer. Specifically, with the application of voltage in long duration, the threshold voltage of the semiconductor device 200 does not easily change with the increase of time with comparison to those depicted in FIG. 1. Therefore, the semiconductor device 200 using the silicon-aluminum-oxide layer 240 as the protection layer may have better electrical performance.

Figure 5:
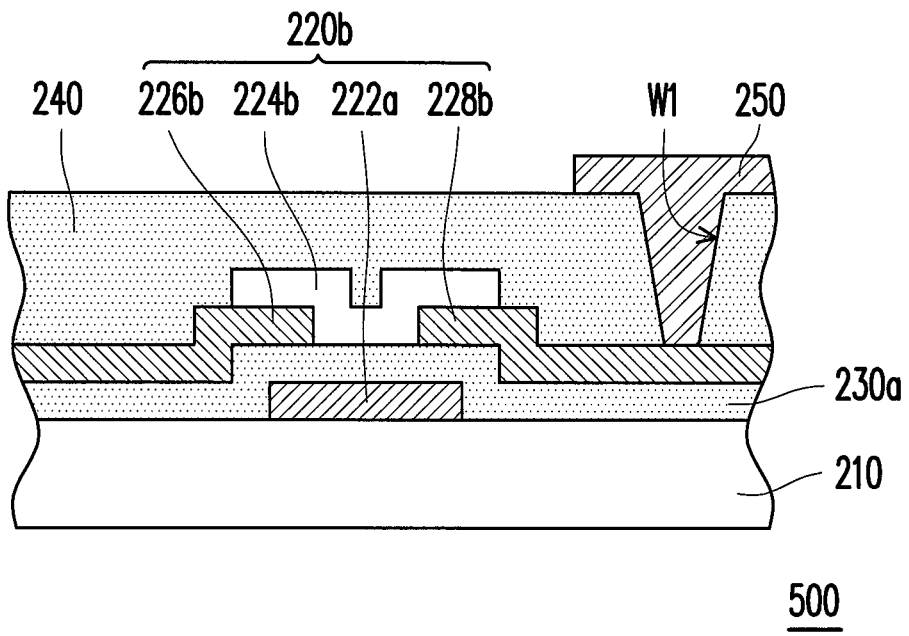
FIG. 5 is a schematic cross-sectional view illustrating a semiconductor device according to another embodiment of the invention.

It is beyond question that in addition to the thin film transistor 220a with an island structure described above, the thin film transistor 220a may also be designed to have a co-planar structure. FIG. 5 is a schematic cross-sectional view illustrating a semiconductor device of another embodiment of the disclosure. Referring to FIG. 5, a thin film transistor 220b in a semiconductor device 500 has a co-planar structure. Specifically, the thin film transistor 220b and the thin film transistor 220a share a similar constitution. Hence like numbers represent like components, like components have like functions, and details of these components will not be further described below. A difference between the thin film transistor 220b and the thin film transistor 220a is that a source 226b and a drain 228b of the thin film transistor 220b are disposed between the channel layer 224b and the substrate 210.

Figure 6:
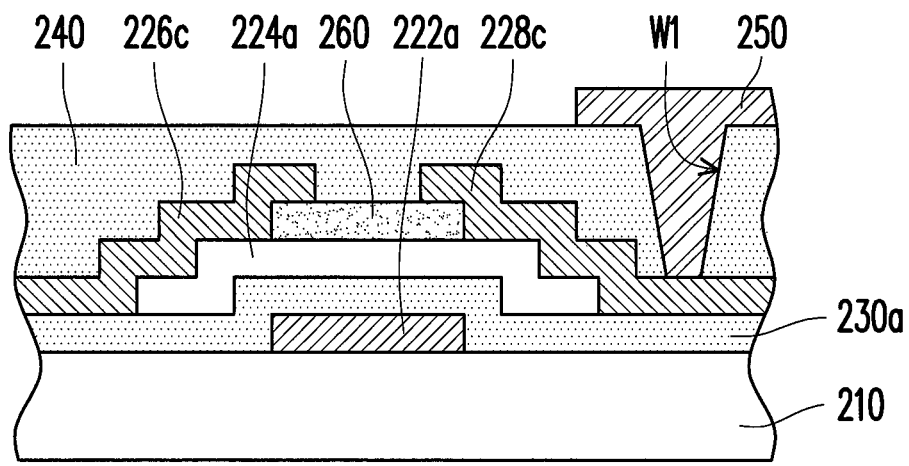
FIG. 6 is a schematic cross-sectional view illustrating a semiconductor device according to an embodiment of the invention.

In addition, as illustrated in FIG. 6, a semiconductor device 600 of the embodiment disclosed herein further includes an etched blocking pattern 260, wherein the etched blocking pattern 260 covers a portion of the channel layer 224a and is disposed between a source 226c, and a drain 228c.

Moreover, in addition to the bottom gate structure described above, a semiconductor device of the disclosure may also have a top gate structure in other embodiments.

Figure 7:
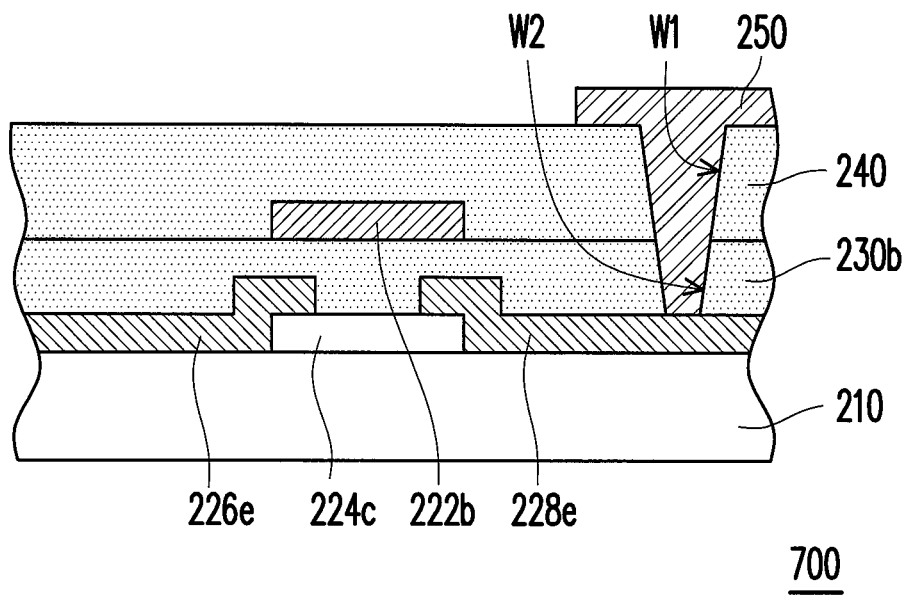
FIG. 7 is a schematic cross-sectional view illustrating a semiconductor device according to an embodiment of the invention.

FIG. 7 is a schematic cross-sectional view illustrating a semiconductor device according to an embodiment of the disclosure. Referring to FIG. 7, a semiconductor device 700 of this embodiment has a similar constitution to the semiconductor device 200 illustrated in FIG. 2F. Thus like numbers represent like components, and details of these components will not be further described below. A difference between the semiconductor device 700 and the semiconductor device 200 is that a channel layer 224c is disposed between the substrate 210 and a gate 222b. Furthermore, a gate insulation layer 230b covers the source 226e and the drain 228e and has a contact window W2, wherein the contact window W2 is connected with the contact window W1 of the silicon-aluminum-oxide layer 240, and the pixel electrode 250 is electrically connected with the drain 228e through the contact window W1 and the contact window W2.

In the embodiment disclosed herein, the gate insulation layer 230b can be formed from the same material as the material of the silicon-aluminum-oxide layer 240, such that the fluorine-series gas can be used as the major etchant and etch the contact windows W1 and W2 at a time. Thereby, the undercut caused by different etch rates of different materials can be avoided. The aforementioned fluorine-series gas includes hexafluoride ($SF_6$) or tetrafluoromethane ($CF_4$).

Figure 8:
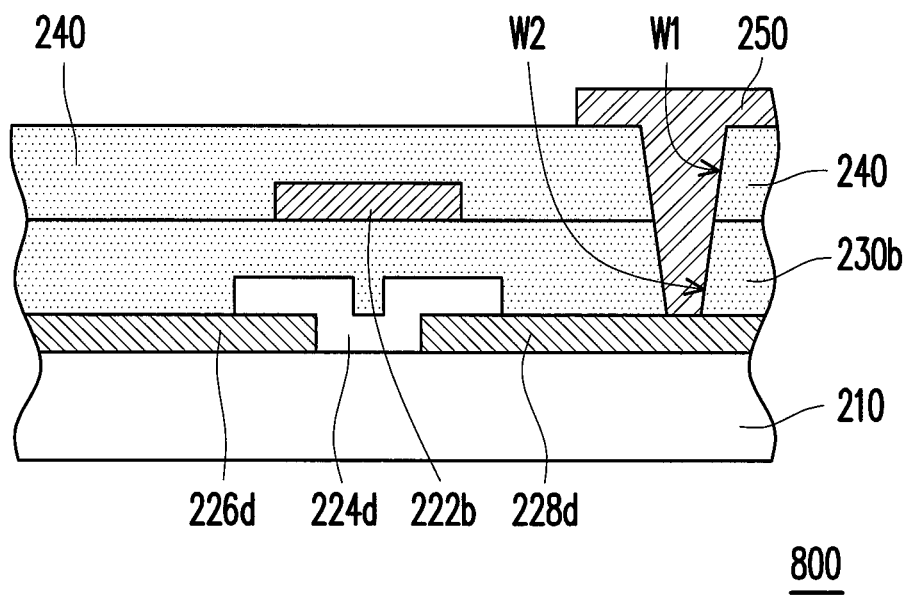
FIG. 8 is a schematic cross-sectional view illustrating a semiconductor device according to another embodiment of the invention.

Alternatively, in addition to the semiconductor device with a top gate island-like structure described above, in other embodiments, a semiconductor device of the disclosure can have a top gate co-planar structure. FIG. 8 is a schematic cross-sectional view illustrating a semiconductor device according to another embodiment of the disclosure. Referring FIG. 8, a semiconductor device 800 of the embodiment disclosed herein and the semiconductor device 700 illustrated in FIG. 7 have a similar structure, but with a difference that a source 226d and a drain 228d of the semiconductor device 800 are disposed on the same plane, and a channel layer 224d covers a portion of the source 226d and a portion of the drain 228d.

Summarizing the description above, compared to the related art using PECVD to form silicon oxide or silicon nitride as the protection layer of a thin-film transistor, the embodiments of the disclosure improve the uniformity and reliability of a semiconductor device by forming a semiconductor device with a silicon-aluminum-oxide layer as the protection layer. Moreover, by using a similar material to form the gate insulation layer as the silicon-aluminum-oxide layer, the undercut caused by different etch rates of different materials when forming the via of the chip bonding pad region or the contact window of the thin film transistor can be avoided.

It will be apparent to those skilled in the art that various modifications and variations can be made to the structure of the disclosure without departing from the scope or spirit of the disclosure. In view of the foregoing, it is intended that the disclosure cover modifications and variations of this invention provided they fall within the scope of the following claims and their equivalents.

What is claimed is:

1. A semiconductor device, comprising:
    a gate disposed on a substrate;
    a channel layer configured on the substrate and overlapped with the gate, wherein a material of the channel layer comprises metal oxide semiconductor;
    a gate insulation layer disposed between the gate and the channel layer, wherein a material of the gate insulation layer comprises silicon-aluminum-oxide;
    a source and a drain disposed at the two sides of the channel layer; and
    a silicon-aluminum-oxide layer disposed on the substrate to cover the source, the drain, and the channel layer, wherein the channel layer is in contact with the silicon aluminum-oxide layer and the gate insulation layer.

2. The semiconductor device as claimed in claim 1, wherein a silicon-to-aluminum content ratio of the silicon-aluminum-oxide layer ranges from 10:90 to 90:10.

3. The semiconductor device as claimed in claim 1, further comprising a pixel electrode disposed on the silicon-aluminum-oxide layer, which is electrically connected with the drain.

4. The semiconductor device as claimed in claim 1, wherein a silicon-to-aluminum content ratio of the gate insulation layer ranges from 10:90 to 90:10.

5. The semiconductor device as claimed in claim 1, wherein the gate is disposed between the substrate and the channel layer.

6. The semiconductor device as claimed in claim 5, wherein the source and the drain are disposed between the channel layer and the substrate.

7. The semiconductor device as claimed in claim 5, wherein the source and the drain are disposed between the channel layer and the silicon-aluminum-oxide layer.

8. The semiconductor device as claimed in claim 7, further comprising an etched blocking pattern covering a portion of the channel layer and disposed among the channel layer, the source, and the drain.

9. The semiconductor device as claimed in claim 1, wherein the channel layer is disposed between the substrate and the gate.

10. The semiconductor device as claimed in claim 5, wherein the channel layer is between the gate and the silicon-aluminum-oxide layer.

11. The semiconductor device as claimed in claim 1, wherein the material of the gate insulation layer is the same as the silicon-aluminum-oxide layer.

12. A method of manufacturing a semiconductor device, comprising:
    forming a gate on a substrate;
    forming a channel layer on the substrate, wherein the channel layer is overlapped with the gate, and a material of the channel layer comprises metal oxide semiconductor;
    forming a gate insulation layer between the gate and the channel layer, wherein a material of the gate insulation layer comprises silicon-aluminum-oxide;
    forming a source and a drain, wherein the source and the drain are disposed at two sides of the channel layer; and
    forming a silicon-aluminum-oxide layer on the substrate and covering the source, the drain, and the channel layer, wherein the channel layer is in contact with the silicon-aluminum-oxide layer and the gate insulation layer.

13. The method of manufacturing a semiconductor device as claimed in claim 12, wherein a silicon-to-aluminum content ratio of the silicon-aluminum-oxide layer ranges from 10:90 to 90:10.

14. The method of manufacturing a semiconductor device as claimed in claim 12, wherein a method of forming the silicon-aluminum-oxide layer comprises a physical vapor deposition.

15. The method of manufacturing a semiconductor device as claimed in claim 12, wherein a silicon-to-aluminum content ratio of the gate insulation layer ranges from 10:90 to 90:10.

16. The method of manufacturing a semiconductor device as claimed in claim 12, further comprising forming a contact window in the silicon-aluminum-oxide layer to expose the drain.

17. The method of manufacturing a semiconductor device as claimed in claim 16, wherein a method of forming the contact window comprises using a fluorine-series gas as the major etchant.

18. The method of manufacturing a semiconductor device as claimed in claim 17, wherein the fluorine-series gas comprises sulfide hexafluoride or tetrafluoromethane.

19. The method of manufacturing a semiconductor device as claimed in claim 16, further comprising forming a pixel electrode on the silicon-aluminum-oxide layer, which is electrically connected to the drain.

20. The method of manufacturing a semiconductor device as claimed in claim 12, further comprising forming an etched blocking pattern covering a portion of the channel layer and disposed among the channel layer, the source, and the drain.

\* \* \* \* \*